(12) United States Patent
Wang et al.

(10) Patent No.: US 8,263,173 B2
(45) Date of Patent: Sep. 11, 2012

(54) LIQUID CRYSTAL DISPLAY PANEL, COLOR FILTER AND MANUFACTURING METHOD THEREOF

(75) Inventors: Wei-Ya Wang, Hsinchu (TW);
Shu-Chin Lee, Hsinchu (TW);
Wen-Lung Chen, Hsinchu (TW);
Fu-Chuan Tsai, Hsinchu (TW);
Yung-Lung Lin, Hsinchu (TW);
Yong-Mao Lin, Hsinchu (TW);
Chun-Chieh Tsao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 1328 days.

(21) Appl. No.: 11/944,415

(22) Filed: Nov. 22, 2007

(65) Prior Publication Data
US 2009/0035518 A1 Feb. 5, 2009

(30) Foreign Application Priority Data
Jul. 31, 2007 (TW) ................................ 96127943 A

(51) Int. Cl.
*B05D 5/06* (2006.01)
(52) U.S. Cl. ......................................................... 427/64
(58) Field of Classification Search .................... 427/64
See application file for complete search history.

(56) References Cited

U.S. PATENT DOCUMENTS

| | | | | |
|---|---|---|---|---|
| 5,593,757 A * | 1/1997 | Kashiwazaki et al. | ..... | 428/195.1 |
| 7,050,130 B2 * | 5/2006 | Sohn et al. | ..... | 349/106 |
| 7,270,846 B2 * | 9/2007 | Shigemura et al. | ..... | 427/162 |
| 2001/0019383 A1 * | 9/2001 | Shin et al. | ..... | 349/106 |
| 2003/0194484 A1 * | 10/2003 | Yamazaki et al. | ..... | 427/66 |
| 2005/0255312 A1 * | 11/2005 | Fujihara et al. | ..... | 428/323 |
| 2006/0188795 A1 | 8/2006 | Hiroaki et al. | | |

FOREIGN PATENT DOCUMENTS

| | | |
|---|---|---|
| CN | 1103928 C | 3/2003 |
| CN | 1584636 | 2/2005 |
| CN | 1825145 | 8/2006 |
| CN | 1945361 | 4/2007 |
| JP | 2003-043238 | 2/2003 |
| TW | 343944 | 11/1998 |
| TW | 200532313 | 10/2005 |
| TW | 200624270 | 7/2006 |

OTHER PUBLICATIONS

"Office Action of Taiwan Counterpart Application", issued on Aug. 15, 2011, p. 1-p. 8.

* cited by examiner

*Primary Examiner* — Michael Cleveland
*Assistant Examiner* — Robert Vetere
(74) *Attorney, Agent, or Firm* — Jianq Chyun IP Office

(57) ABSTRACT

A manufacturing method of a color filter including following steps is provided. First, a partition is formed on a substrate to form a plurality of pixel regions on the substrate. Next, a color pigment is provided along a continuous pigment-providing route, so as to form the color pigment on a sequence of pixel regions among the plurality of pixel regions and the partition. The method mentioned above can prevent the unfilled phenomenon of the pigment around the corners of the pixel region. Besides, a liquid crystal display panel having the color filter is also provided.

18 Claims, 10 Drawing Sheets

LIQUID CRYSTAL DISPLAY PANEL, COLOR FILTER AND MANUFACTURING METHOD THEREOF

CROSS-REFERENCE TO RELATED APPLICATION

This application claims the priority benefit of Taiwan application serial no. 96127943, filed on Jul. 31, 2007. All disclosure of the Taiwan application is incorporated herein by reference.

BACKGROUND OF THE INVENTION

1. Field of the Invention

The present invention relates to a display device and a manufacturing method thereof, and more particularly to a liquid crystal display (LCD) panel, a color filter, and a manufacturing method thereof.

2. Description of Related Art

Generally, in a manufacturing method of color filter for a common LCD, RGB photo resists are adopted to be processed by three photolithography processes, and three color photo resist films are sequentially formed in pixels on a substrate, thereby forming a color filter. The color photo resist films are formed by dripping the photo resist liquid on the substrate and then spin-coating the photo resist liquid on the substrate uniformly. As a result, most of the color photo resist is wasted during the spin-coating process, and furthermore, the photo resist is expensive, thereby causing a high manufacturing cost. In addition, the adopted photolithography processes require plenty of organic solvent, which possibly causes environmental contamination.

Recently, a method of forming a color filter by using an inkjet printing (IJP) process has been developed. The method includes the following steps, firstly, forming a black matrix with a plurality of openings on a substrate; then, dripping color pigments (red, green, and blue) into the openings of the black matrix by using an inkjet print head; and then performing a thermal baking process to cure the pigments, thereby forming a color filter. The inkjet printing method can simultaneously inkjet print RGB filter films in pixels, and significantly save the manufacturing processes and the material cost compared with the conventional photolithography processes adopted in manufacturing the color filter, so that the inkjet printing technology has an advantage of being manufactured in a large area.

Generally speaking, when the color filter is manufactured by using the inkjet printing technology, it is expected that all color pigments are dripped completely in pixel regions, so as to prevent the color pigments from overflowing or being mixed with each other. Therefore, the conventional process of dripping the color pigments in a pixel region requires that the positions of the first drop and the last drop of the color pigments in a pixel region are kept a certain distance away from the edge of the pixel region. In this manner, if the position where the color pigment is dripped is slightly inaccurate, the color pigment may be prevented from overflowing the pixel region to be mixed with other pigments. However, although such an inkjet printing method is capable of preventing the color pigments from overflowing or being mixed with other pigments, if the pixel region has a poor hydrophile property or the pixel region is too large, the unfilled phenomenon of the color pigment possibly occurs at the corners of the pixel region, and as a result, an LCD panel has a poor color saturation and poor displaying quality.

SUMMARY OF THE INVENTION

Accordingly, the present invention provides a method of manufacturing a color filter, capable of preventing the unfilled phenomenon from occurring at an edge of a pixel region.

Through the aforementioned manufacturing method, the present invention further provides a color filter with high quality.

The present invention further provides an LCD panel employing the color filter and having desirable color saturation.

The present invention further provides an ink-jetting apparatus, which is suitable for being used in a manufacturing process of the color filter, so as to manufacture a color filter with a desirable quality.

In order to further describe the content of the present invention in detail, the present invention provides a method of manufacturing a color filter, which includes the following steps, firstly, providing a substrate and forming a partition on the substrate, so as to form a plurality of pixel regions on the substrate; then, providing a color pigment in a continuous pigment-providing route, so as to form the color pigment on a sequence of pixel regions among the plurality of pixel regions and on at least a part of the partition.

In an embodiment of the present invention, the method further comprises a step of providing another color pigment in another continuous pigment-providing route, so as to form another color pigment in another sequence of pixel regions among the plurality of pixel regions and on at least a part of the partition, in which the sequence of pixel regions and another sequence of pixel region are adjacent to each other, for example. Furthermore, the color pigment and another color pigment may be provided simultaneously or sequentially.

In an embodiment of the present invention, the continuous pigment-providing route is a linear route or a zigzag route.

In an embodiment of the present invention, the process of providing the color pigment is to spray the color pigment on the substrate by using an inkjet print head, and the practical operation is to spray the color pigment by means of, for example, moving the inkjet print head along the continuous pigment-providing route, moving the substrate along the continuous pigment-providing route, or moving the substrate and the inkjet print head with respect to each other along the continuous pigment-providing route.

In an embodiment of the present invention, the color pigment may be further cured to form a color filtering material.

In an embodiment of the present invention, the thickness of the color filtering material on at least a part of the partition is approximately larger than 0 μm and smaller than or equal to 0.4 μm.

In an embodiment of the present invention, the thickness of the color filtering material on at least a part of the partition is about 0.3 μm.

In an embodiment of the present invention, after forming the color pigment, a conductive layer is further formed on the substrate. Furthermore, after forming the color pigment and before forming the conductive layer, a planarization layer is further formed on the substrate.

In an embodiment of the present invention, the method of manufacturing the color filter further comprises providing a color pigment in a secondary continuous pigment-providing route, so as to form the color pigment in a sequence of pixel regions among a plurality of pixel regions and on at least a part of the partition. The secondary continuous pigment-providing route is, for example, parallel to the continuous pigment-providing route, so as to provide a color pigment in the same pixel region.

The present invention provides a color filter, which includes a substrate, a partition, and at least one color filtering material. The partition is disposed on the substrate, so as to form a plurality of pixel regions. The color filtering material is located in at least one sequence of the pixel regions among the plurality of pixel regions and on at least a part of the partition.

In an embodiment of the present invention, the thickness of the color filtering material on the partition is approximately larger than 0 μm and smaller than or equal to 0.4 μm.

In an embodiment of the present invention, the thickness of the color filtering material on the partition is about 0.3 μm.

In an embodiment of the present invention, the at least one color filtering material is a red pigment, a green pigment, a blue pigment, or a combination thereof.

In an embodiment of the present invention, the pixel regions are arranged in an array or in a mosaic manner.

In an embodiment of the present invention, the at least one sequence of pixel regions are arranged in a straight line or a zigzag shape.

In an embodiment of the present invention, the color filter further includes a conductive layer located on the partition and at least one color filtering material.

In an embodiment of the present invention, the color filter further includes a planarization layer located below the conductive layer and used for covering the partition and at least one color filtering material.

In an embodiment of the present invention, the color filter further includes a hydrophobic layer on the partition.

The present invention provides an LCD panel, which includes an array substrate, a color filter, and a liquid crystal layer. The color filter includes a substrate, a partition, and at least one color filtering material. The partition is disposed on the substrate, so as to form a plurality of pixel regions on the substrate. At least one color filtering material is located in at least one sequence of pixel regions among the plurality of pixel regions and on at least a part of the partition. The liquid crystal layer is sandwiched between the array substrate and the color filter.

The present invention provides an ink-jetting apparatus, which includes a first inkjet print head, a second inkjet print head, and a connecting means. The first inkjet print head has a row of first nozzles, and the second inkjet print head has a row of second nozzles. The row of first nozzles and the row of second nozzles are arranged alternately. The connecting means is disposed between the first inkjet print head and the second inkjet print head to connect the first inkjet print head with the second inkjet print head.

In an embodiment of the present invention, the ink-jetting apparatus further includes a third inkjet print head and another connecting means. The third inkjet print head has a row of third nozzles, and the third nozzles of the third inkjet print head and the second nozzles of the second inkjet print head are arranged alternately. Another connecting means is disposed between the third inkjet print head and the second inkjet print head to connect the third inkjet print head with the second inkjet print head.

In an embodiment of the present invention, the connecting means is an adhesive.

In the method of manufacturing a color filter provided by the present invention, the color pigment is sprayed along the continuous pigment-providing route, thereby preventing the unfilled phenomenon of the color pigment in the conventional technology from occurring to the corners of a pixel region and further enhancing the quality and production yield of the color filter.

In order to make the aforementioned and other objects, features, and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
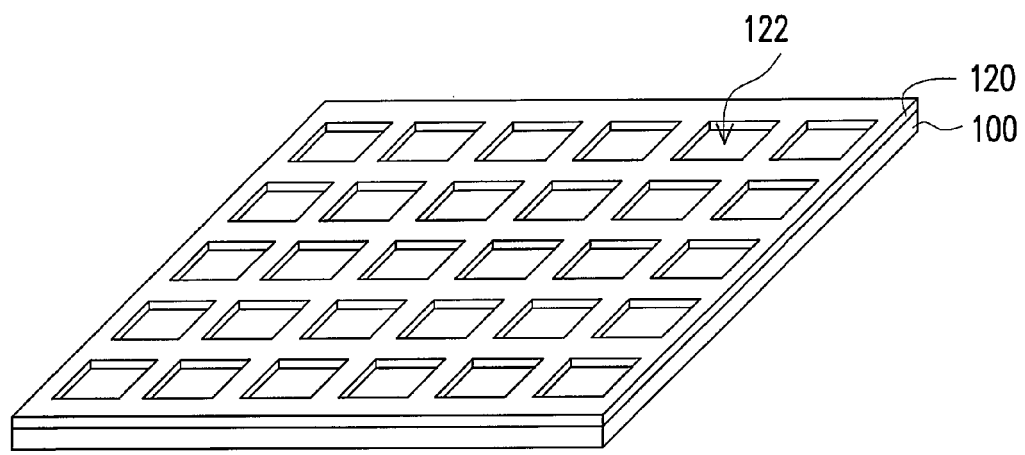
FIGS. 1A to 1D are schematic views of a process for manufacturing a color filter according to an embodiment of the present invention.

FIGS. 1A to 1D are schematic views of a process for manufacturing a color filter according to an embodiment of the present invention. Referring to FIG. 1A, firstly, a substrate 100 is provided, and the material of the substrate 100 is, for example, a transparent rigid substrate, such as glass. Then, a partition 120 is formed on the substrate 100, so as to form a plurality of pixel regions 122 on the substrate 100. In an embodiment, the partition 120 may be a material with a low light transmittance and a small reflectance, such as an opaque metal film and a resin having a black dye, or the opaque metal film and the resin having a black dye are both used simultaneously.

Figure 1B:
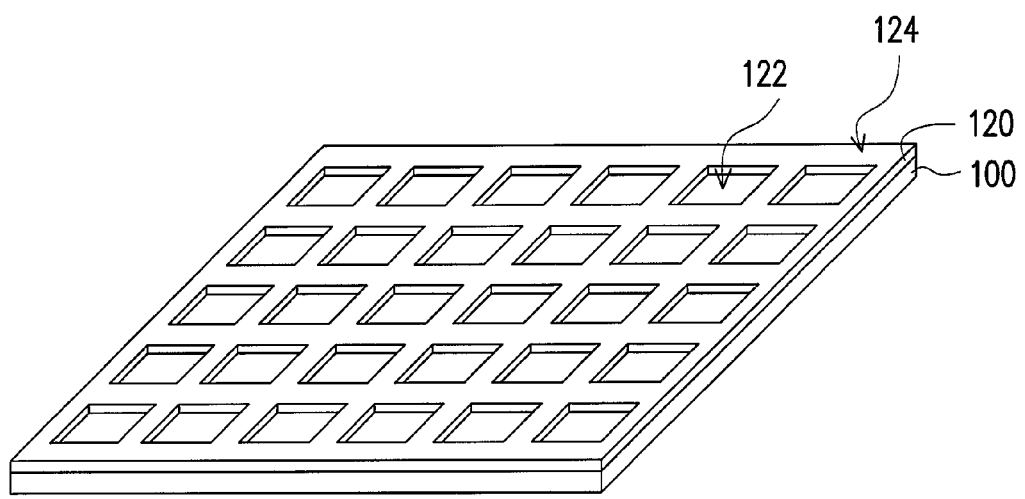

Furthermore, in order to prevent the subsequently-spayed color pigments from overflowing or being mixed with each other, a hydrophobic treatment may be further performed on the partition 120. As shown in FIG. 1B, the hydrophobic treatment may be performed on the surface of the partition 120 by using a fluoride-containing plasma, so as to form a hydrophobic layer 124 or hydrophobic surface on the partition 120. The gas source for forming the fluoride-containing plasma is, for example, $CF_4$, $SF_6$, or another fluoride-containing gas. Of course, besides performing the hydrophobic treatment on the surface of the partition by using the fluoride-containing plasma, a hydrophobic layer 124 may be additionally formed on the partition 120 by means of deposition after the partition 120 is formed, or the partition 120 is made to have the hydrophobic property through another existing process.

Figure 1C:
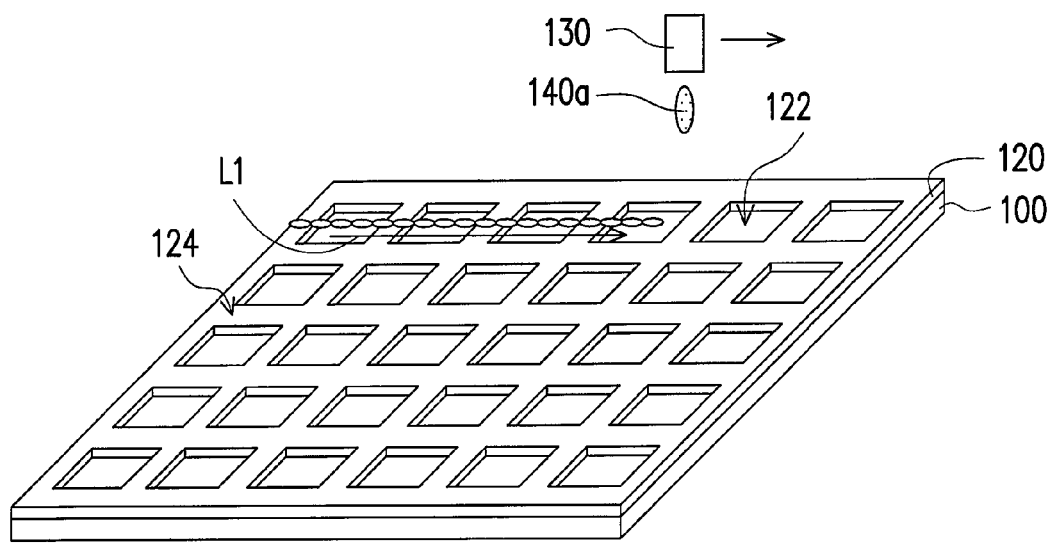

Referring to FIG. 1C, a color pigment 140a is provided in a continuous pigment-providing route L1, so as to form the color pigment 140a in a sequence of pixel regions 122 among the plurality of pixel regions 122 and on the partition 120. Particularly, in this embodiment, the color pigment 140a is sprayed on the plurality of pixel regions 122 on the substrate 100 along the continuous pigment-providing route L1 by moving an inkjet print head 130. Furthermore, the relative position between the inkjet print head 130 and the substrate 100 can also be controlled by moving the substrate 100 or moving the substrate 100 and the inkjet print head 130 with respect to each other, so as to spray the color pigment 140a in the pixel regions 122.

Figure 1D:
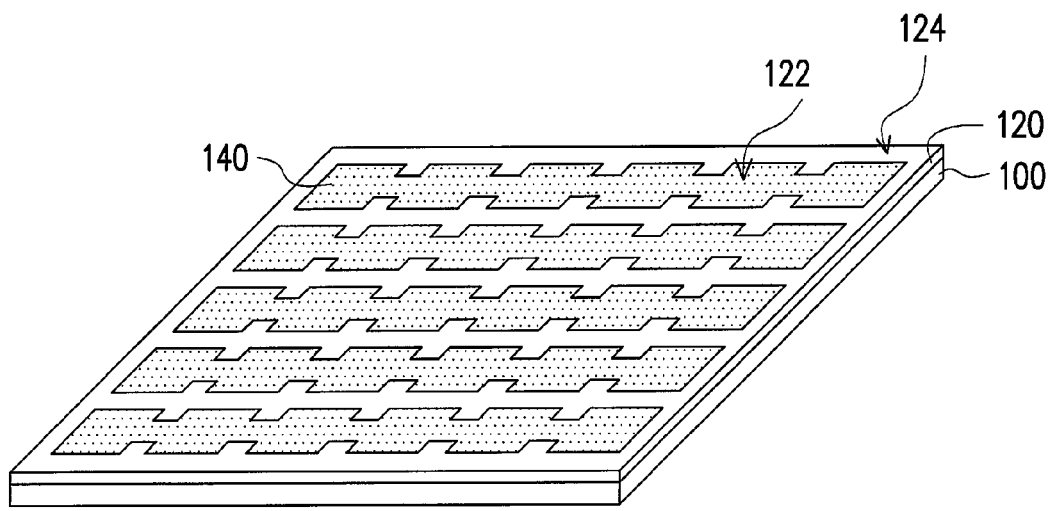

It should be mentioned that, the inkjet print head 130 provides the color pigment 140a along the continuous pigment-providing route L1, i.e., the color pigment 140a is continuously provided along the continuous pigment-providing route L1. Therefore, the color pigment 140a is left above the pixel regions 122 and on at least a part of or all of the partition 120, as shown in FIGS. 1C and 1D. In this way, the unfilled phenomenon of the color pigment 140a does not easily occur at the corners of each pixel region 122. Furthermore, since the inkjet print head 130 continuously provides the color pigment 140a when it moves above the partition 120, and the partition 120 has the hydrophobic property, only a part of the color pigment 140a is left on the partition 120, which does not cause the color pigment 140a to overflow or to be mixed up. In an embodiment, the color pigment 140a may be further cured, so as to form a color filtering material 140 in the pixel regions 122. In this embodiment, the thickness of the color filtering material 140 on the partition 120 is approximately in a range from 0 μm to 0.4 μm, preferable about 0.3 μm.

Figure 2:
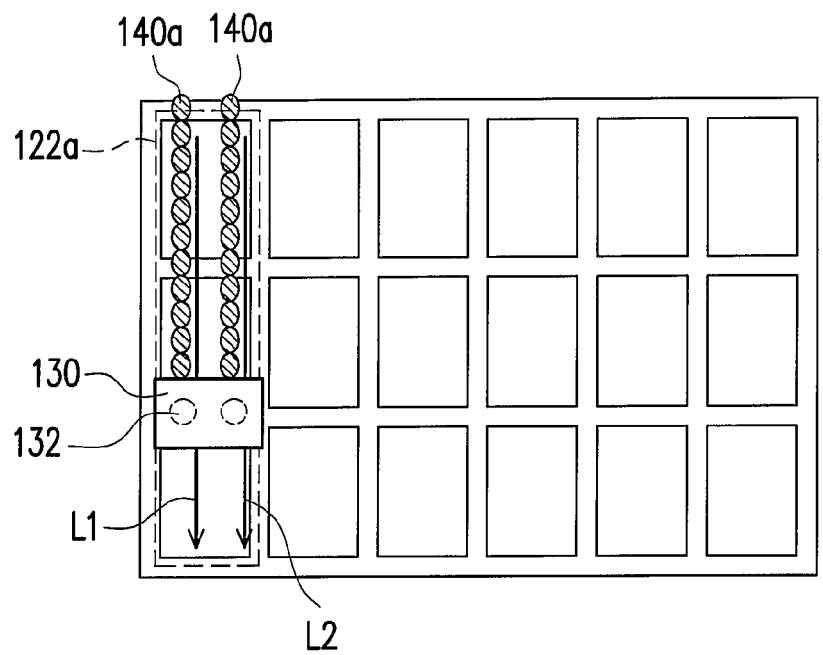
FIG. 2 is a schematic view of two nozzles for providing color pigment to the same sequence of the pixel regions simultaneously.

Besides using the same nozzle to provide the color pigment to a sequence of pixel regions, two or more nozzles may also be used to provide the color pigment to the same sequence of pixel regions. FIG. 2 is a schematic view of using, for example, two nozzles to provide the color pigment to the same sequence of the pixel regions simultaneously. Referring to FIG. 2, the inkjet print head 130 includes two nozzles 132 for providing the color pigment 140a to the same sequence of pixel regions 122a and at least a part of partition 120 simultaneously along the continuous pigment-providing route L1 and the secondary continuous pigment-providing route L2. In this manner, if the area of the pixel regions 122 is too large, two or more than two nozzles 132 can be used to provide the color pigment 140a to the same sequence of pixel regions 122a simultaneously. Therefore, the unfilled phenomenon of the color pigment 140a can be effectively prevented from occurring at the corners of the pixel regions 122, and the manufacturing rate can be enhanced.

Figure 3:
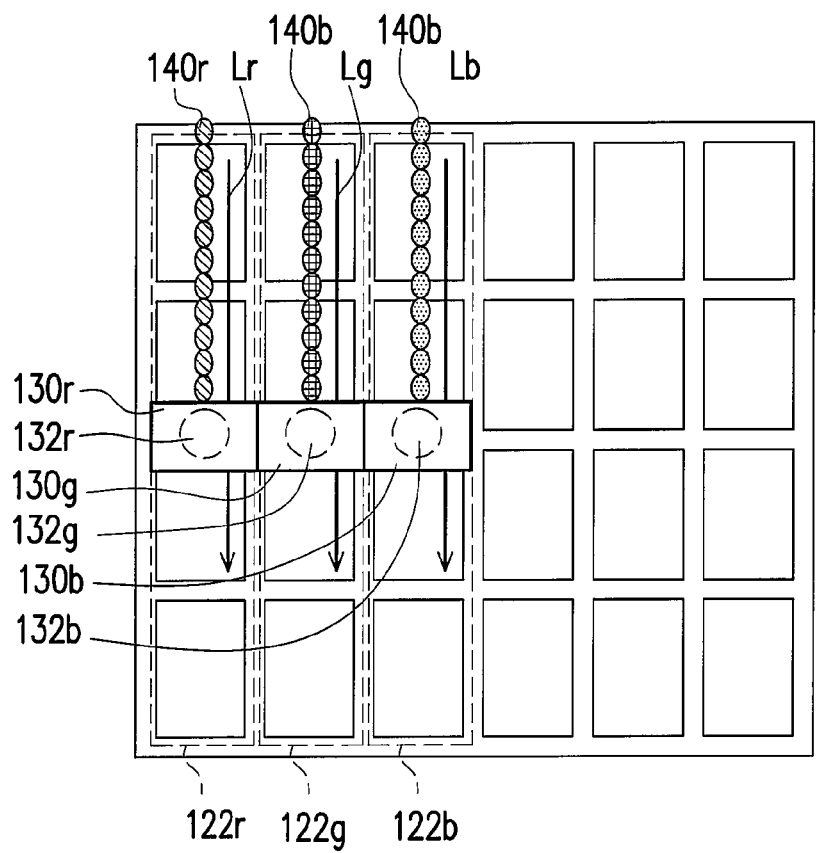
FIG. 3 is a schematic view of spraying the color pigment on one sequence of the pixel regions and another sequence of the pixel regions simultaneously.

Besides the above ink-jetting manner, another color pigment is further provided in another continuous pigment-providing route. Referring to FIG. 3, a first inkjet print head 130r, a second inkjet print head 130g, and a third inkjet print head 130b adopted herein are parallel to each other, so that a first nozzle 132r, a second nozzle 132g, and a third nozzle 132b are used to provide a first color pigment 140r, a second color pigment 140g, and a third color pigment 140b in a first, second, and third sequences of pixel regions 122r, 122g, and 122b simultaneously. Particularly, the first inkjet print head 130r provides the first color pigment 140r along the first continuous pigment-providing route Lr, the second inkjet print head 130g provides the second color pigment 140g along the second continuous pigment-providing route Lg, and the third inkjet print head 130b provides the third color pigment 140b along the third continuous pigment-providing route Lb. In this manner, the first, second, and third color pigments 140r, 140g, and 140b are respectively formed in the first, second, and third sequences of pixel regions 122r, 122g, and 122b, and at least a part of or all of the partition 120. The first, second, and third sequences of pixel regions 122r, 122g, and 122b are, for example, adjacent to each other. The first, second, and third color pigments 140r, 140g, and 140b are, for example, a red pigment, a green pigment, a blue pigment, or any combination thereof.

Figure 4:
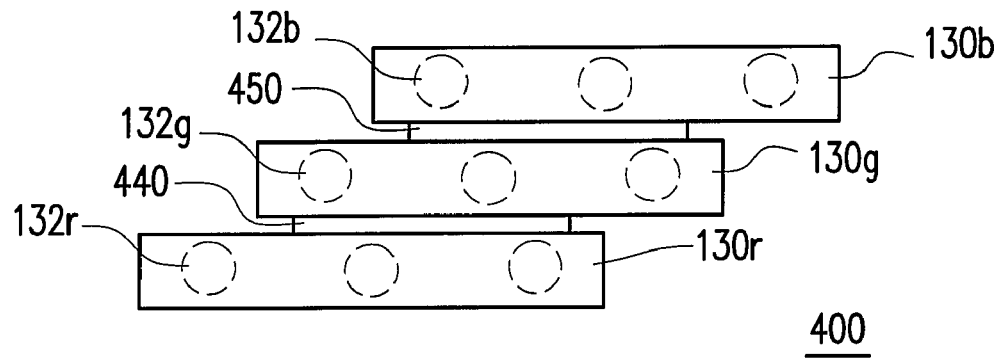
FIG. 4 is a schematic view of an ink-jetting apparatus according to an embodiment of the present invention.

Besides the ink-jetting method shown in FIG. 3, in the present invention, through the design of the inkjet print head, different color pigments are sequentially provided to the different sequences of pixel regions. FIG. 4 is a schematic view of an ink-jetting apparatus according to an embodiment of the present invention. Referring to FIG. 4, the ink-jetting apparatus 400 includes the first inkjet print head 130r, the second inkjet print head 130g, the third inkjet print head 130b, a connecting means 440, and another connecting means 450. The connecting means 440 and the connecting means 450 are, for example, adhesive or locking elements. The first inkjet print head 130r has a row of first nozzles 132r, the second inkjet print head 130g has a row of second nozzles 132g, and the third inkjet print head 130b has a row of third nozzles 132b. The first nozzles 132r of the first inkjet print head 130r and the second nozzles 132g of the second inkjet print head 130g are arranged alternately, and the second nozzles 132g of the second inkjet print head 130g and the third nozzles 132b of the third inkjet print head 130b are arranged alternately. Furthermore, the connecting means 440 is disposed between the first inkjet print head 130r and the second inkjet print head 130g, so as to connect the first inkjet print head 130r to the second inkjet print head 130g. Similarly, the connecting means 450 is disposed between the second inkjet print head 130g and the third inkjet print head 130b, so as to connect the second inkjet print head 130g to the third inkjet print head 130b. In this manner, the ink-jetting apparatus 400 may sequentially spray the color pigments on the sequences of pixel regions, so as to spray color pigments on a pixel region array with a large area, and thereby enhance the production efficiency.

Figure 5:
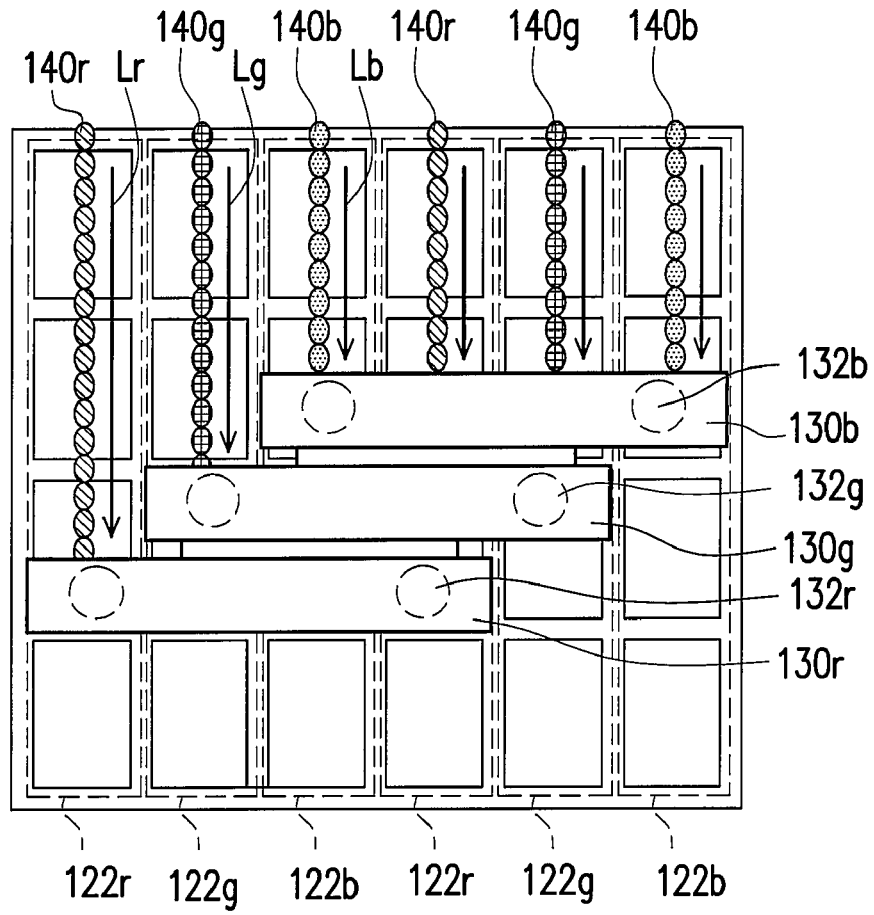
FIG. 5 is a schematic view of spraying the color pigment by using the ink-jetting apparatus in FIG. 4.

FIG. 5 is a schematic view of spraying the color pigments by using the ink-jetting apparatus. Referring to FIG. 5, the row of first nozzles 132r, the row of second nozzles 132g, and the row of third nozzles 132b sequentially provide the first color pigments 140r, the second color pigments 140g, and the third color pigments 140b to the first, second, and third sequences of pixel regions 122r, 122g, and 122b. The first, second, and third inkjet print heads 130r, 130g, and 130b provide the first, second, and third color pigments 140r, 140g, and 140b along the first, second, and third continuous pigment-providing routes Lr, Lg, and Lb, respectively. Particularly, since the row of first nozzles 132r, the row of second nozzles 132g, and the row of third nozzles 132b are arranged alternately, when the first nozzles 132r begins to provide the first color pigment 140r to the first sequence of pixel regions 122r, the second nozzles 132g does not begin to provide the second color pigment 140g to the second sequence of pixel regions 122g yet; similarly, when the second nozzles 132g begins to provide the second color pigment 140g to the second sequence of pixel regions 122g, the third nozzles 132b does not begin to provide the third color pigment 140b to the third sequence of pixel regions 122b. That is, three inkjet print heads 130r, 130g, and 130b sequentially provide three color pigments 140r, 140g, and 140b to the three sequences of pixel regions 122r, 122g, and 122b. The method of spraying color pigments by using such an ink-jetting apparatus is suitable for spraying a pixel region array with a large area, thereby further enhancing the production efficiency.

Figure 6:
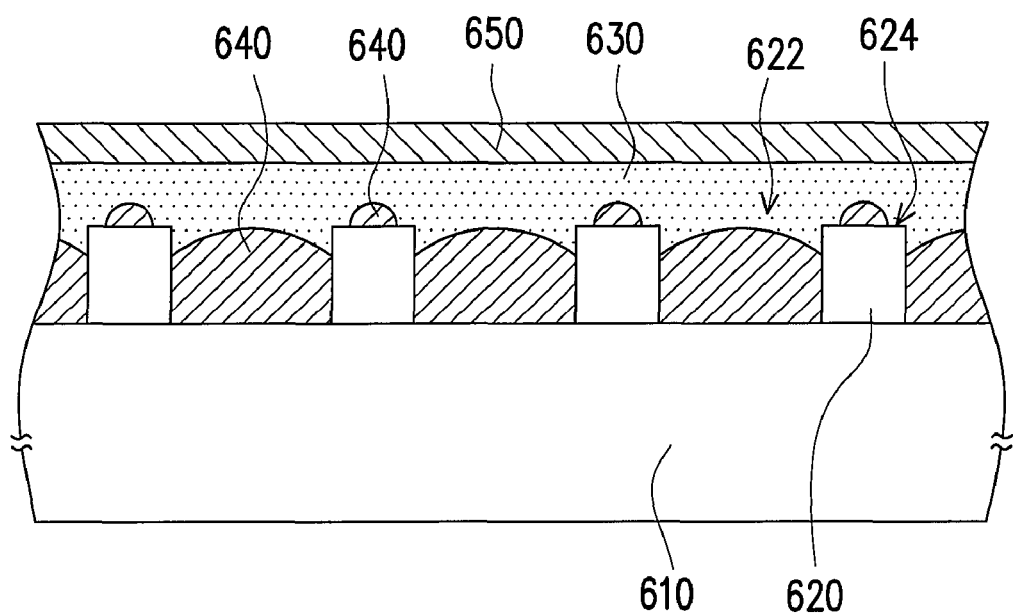
FIG. 6 is a schematic sectional view of a color filter according to an embodiment of the present invention.

FIG. 6 is a schematic sectional view of a color filter according to an embodiment of the present invention. The color filter 600 includes a substrate 610, a partition 620, and at least one color filtering material 640. The partition 620 is disposed on the substrate 610, so as to form a plurality of pixel regions 622 on the substrate 610. The color filtering material 640 is located in at least one sequence of pixel regions 622 among the plurality of pixel regions 622 and on the partition 620. The color filtering material 640 may be a red pigment, a green pigment, a blue pigment, or a combination thereof. Since the color filtering material 640 is sprayed on a sequence of pixel regions 622 along the continuous pigment-providing route, the unfilled phenomenon of the color filtering material 640 does not occur easily at the corners of each pixel region 622. Furthermore, since the color filtering material 640 is sprayed along the continuous pigment-providing route, the color filtering material 640 is also left on the partition 620.

Referring to FIG. 6, the color filter 600 further includes a planarization layer 630 and a conductive layer 650. The conductive layer 650 is located on the partition 620 and the color filtering material 640, so as to serve as a common electrode of the color filter 600. The planarization layer 630, located below the conductive layer 650, covers the partition 620 and the color filtering material 640. Furthermore, the color filter 600 further includes a hydrophobic layer 624 on the partition 620, so as to prevent the sprayed color pigments from overflowing and being mixed up. Furthermore, the hydrophobic layer 624 may be formed as follows, for example, performing the hydrophobic treatment on the surface of the partition 620 by using fluoride-containing plasma or forming a hydrophobic layer 624 on the partition 620 by means of deposition.

Figure 7A:
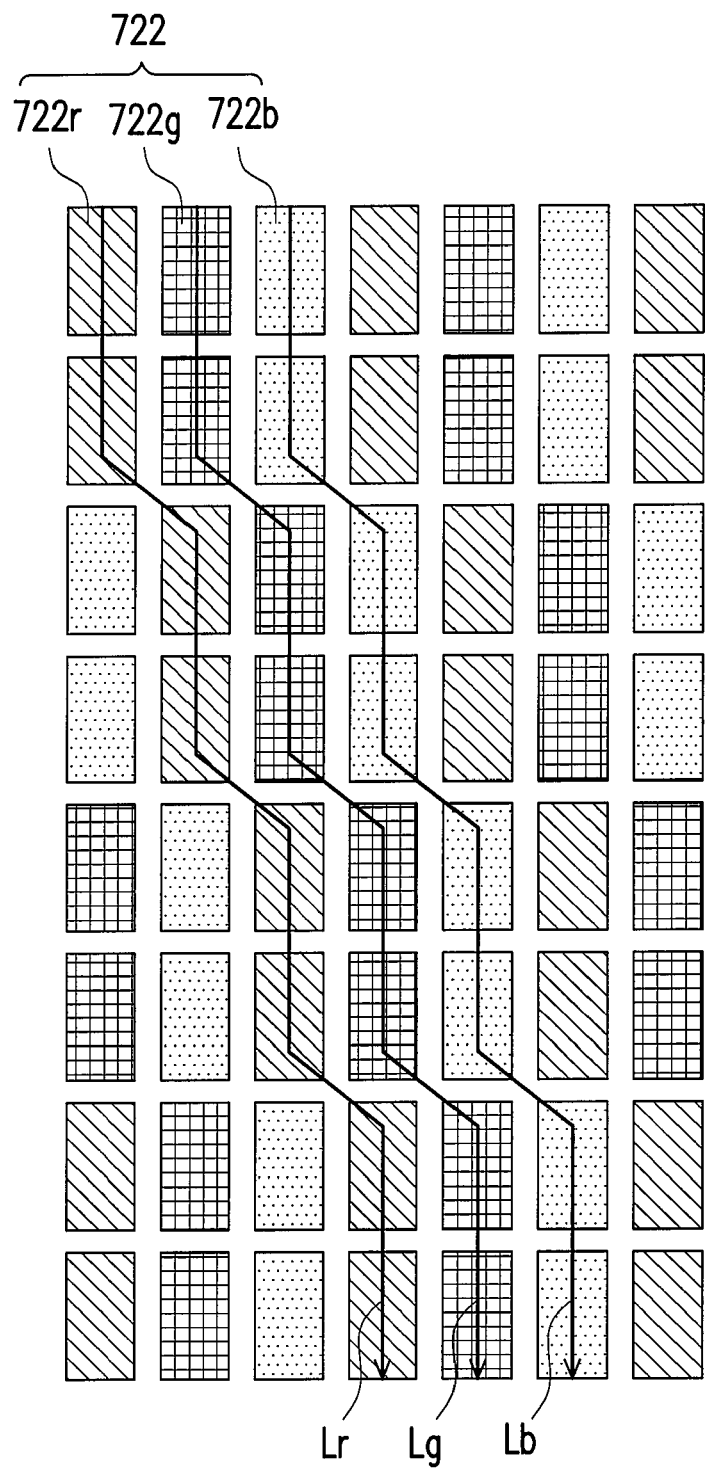
FIGS. 7A and 7B are schematic views of pixel regions arranged in an array.
Figure 7B:
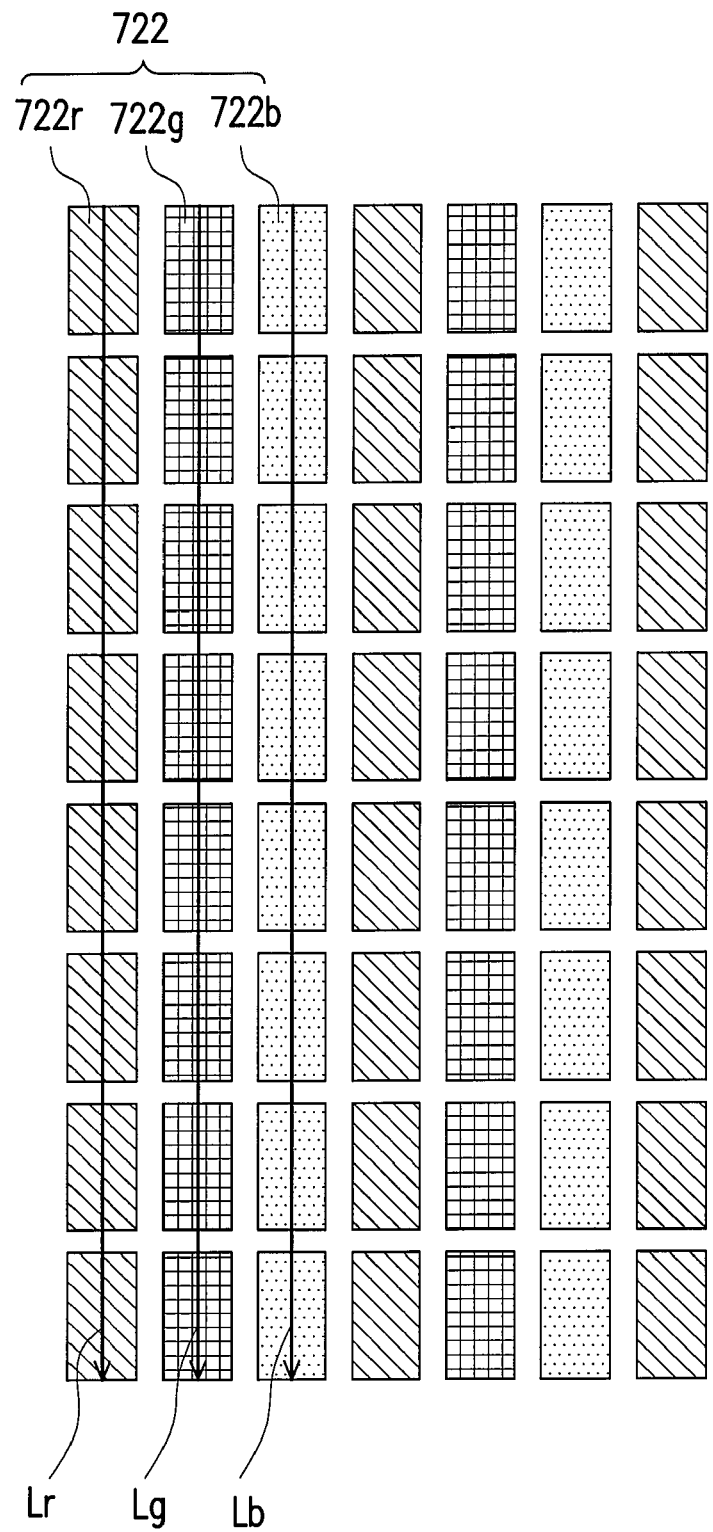
Figure 7C:
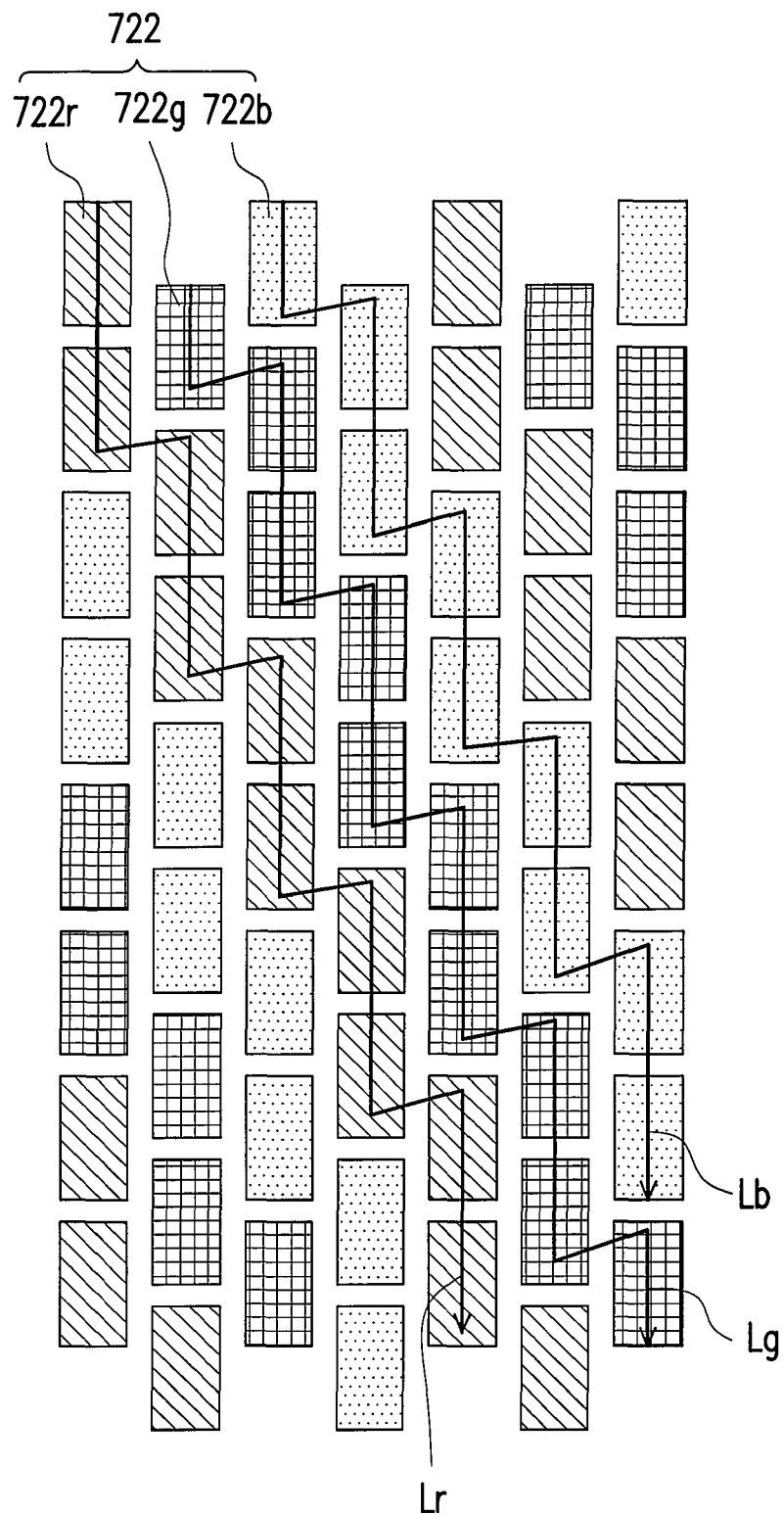
FIGS. 7C and 7D are schematic views of the pixel regions arranged in a mosaic manner.
Figure 7D:
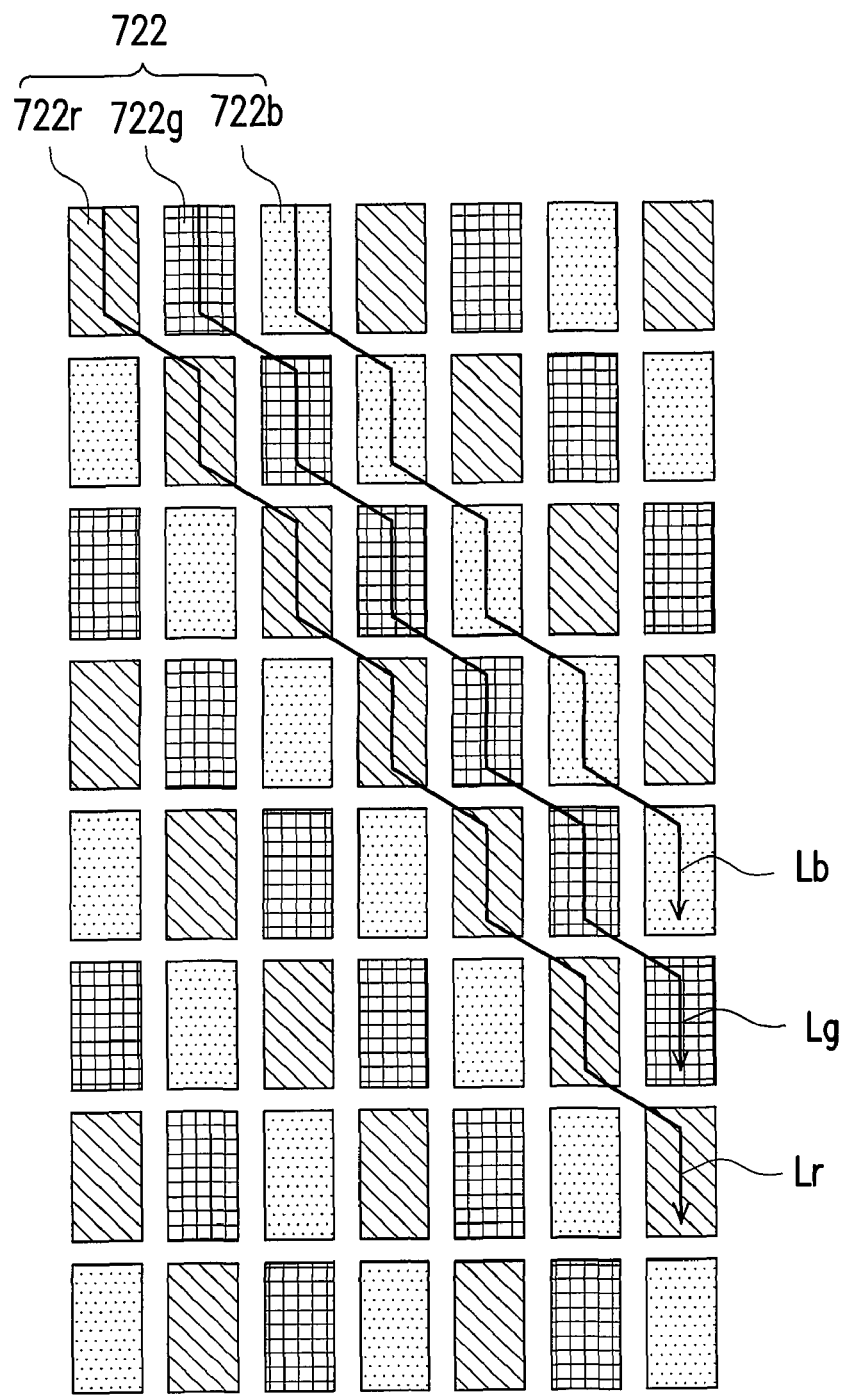

Furthermore, the continuous pigment-providing routes may be adjusted depending upon the different arrangement manner of the pixel regions. FIGS. 7A and 7B show the pixel regions arranged in an array. FIGS. 7C and 7D show the pixel regions arranged in a mosaic manner. Particularly, the pixel regions 722 arranged in an array or in a mosaic manner include sub-pixel regions of three different colors, for example, red sub-pixel regions 722r, green sub-pixel regions 722g, and blue sub-pixel regions 722b. In FIGS. 7A, 7C, and 7D, the red, green, and blue sub-pixel regions 722r, 722g, and 722b in the sequence are arranged into a zigzag shape, so that the first, second, and third continuous pigment-providing routes Lr, Lg, and Lb are designed as zigzag routes. In FIG. 7B, the red, green, and blue sub-pixel regions 722r, 722g, and 722b in the sequence are arranged in a straight line, so that the first, second, and third continuous pigment-providing routes Lr, Lg, and Lb are designed as linear routes.

Figure 8:
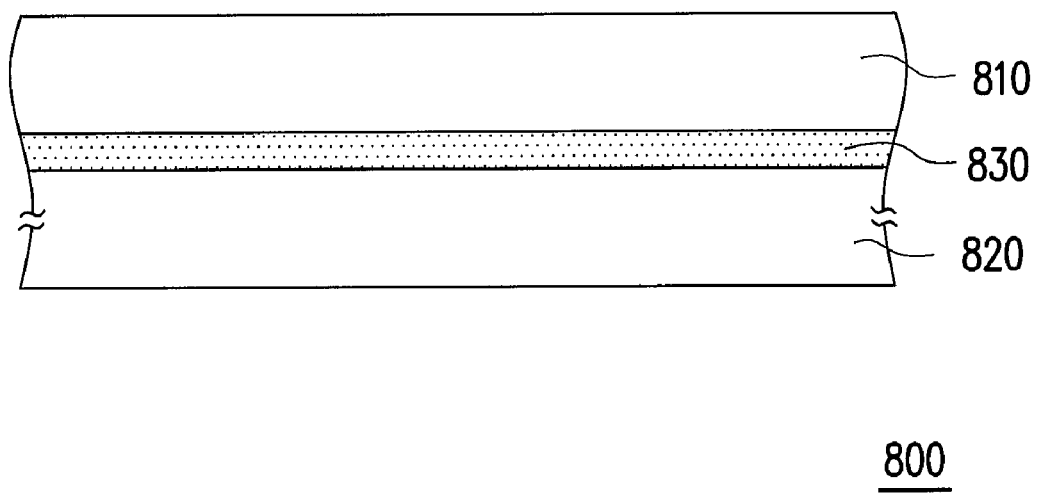
FIG. 8 is a schematic view of an LCD panel according to an embodiment of the present invention.

FIG. 8 is a schematic view of an LCD panel according to an embodiment of the present invention. Referring to FIG. 8, the LCD panel 800 includes an array substrate 810, a color filter 820, and a liquid crystal layer 830. The color filter 820 and the array substrate 810 are disposed facing each other, and the liquid crystal layer 830 is sandwiched between the array substrate 810 and the color filter 820. It should be mentioned that, the color filter 820 adopted herein is, for example, the color filter 600 mentioned in the above embodiment, or the color filter manufactured by using the above methods, which is not limited here.

In view of the above, the ink-jetting apparatus, the LCD panel, the color filter, and the manufacturing method thereof provided by the present invention have the following advantages.

1. The color pigments are sprayed along the continuous pigment-providing routes. Therefore, compared with the conventional method, the unfilled phenomenon of the color pigments does not easily occurs at the corners of the pixel regions, thereby enhancing the quality and production yield of the color filter. Furthermore, the LCD panel using the color filter manufactured by the above method has desirable color saturation and superior displaying quality.

2. As for the ink-jetting apparatus provided by the present invention, the first nozzles, the second nozzles, and the third nozzles of the ink-jetting apparatus are arranged alternately, the relative positions thereof are fixed by the connecting means, so that the color pigments are sequentially sprayed on the sequences of pixel regions, which can be applied on a pixel region array with a large area and thus enhances the production efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a color filter, comprising:
   (a) providing a substrate and forming a partition on the substrate to form a plurality of pixel regions on the substrate, wherein the partition has a top surface provided with hydrophobic property;
   (b) providing a color pigment in a continuous pigment-providing route to form the color pigment in a sequence of pixel regions among the plurality of pixel regions and on the top surface of the partition, wherein the color pigment on the top surface of the partition exposes a part of the top surface due to the hydrophobic property, the sequence of pixel regions is arranged into a zigzag shape, and the continuous pigment-providing route is a zigzag route; and
   (c) curing the color pigment to form a color filtering material, wherein the thickness of the color filtering material on at least a part of the partition is larger than or equal to 0.3 μm, and smaller than or equal to 0.4 μm.

2. The method as claimed in claim 1, further comprising: providing another color pigment in another continuous pigment-providing route to form another color pigment in another sequence of pixel regions among the plurality of pixel regions and on at least a part of the partition.

3. The method as claimed in claim 2, wherein the sequence of pixel regions is adjacent to another sequence of pixel regions.

4. The method as claimed in claim 3, wherein the color pigment and another color pigment are provided simultaneously.

5. The method as claimed in claim 3, wherein the color pigment and another color pigment are provided sequentially.

6. The method as claimed in claim 1, wherein the step of providing the color pigment comprises spraying the color pigment on the substrate by using an inkjet print head.

7. The method as claimed in claim 6, wherein the step of spraying the color pigment on the substrate by using an inkjet print head comprises moving the substrate and the inkjet print head with respect to each other along the continuous pigment-providing route.

8. The method as claimed in claim 1, further comprising forming a conductive layer on the substrate after Step (b).

9. The method as claimed in claim 1, further comprising:
provoding the color pigment on a secondary continuous pigment-providing route to form the color pigment in the sequence of pixel regions among the plurality of pixel regions and on at least a part of the partition.

10. A method of manufacturing a color filter, comprising:
(a) providing a substrate and forming a partition on the substrate to form a plurality of pixel regions on the substrate;
(b) providing a color pigment in a continuous pigment-providing route to form the color pigment in a sequence of pixel regions among the plurality of pixel regions and on at least a part of the partition, wherein the sequence of pixel regions is arranged into a zigzag shape, and the continuous pigment-providing route is a zigzag route; and
(c) curing the color pigment to form a color filtering material, wherein the thickness of the color filtering material on at least a part of the partition is larger than or equal to 0.3 µm and smaller than or equal to 0.4 µm.

11. The method as claimed in claim 10, further comprising: providing another color pigment in another continuous pigment-providing route to form another color pigment in another sequence of pixel regions among the plurality of pixel regions and on at least a part of the partition.

12. The method as claimed in claim 11, wherein the sequence of pixel regions is adjacent to another sequence of pixel regions.

13. The method as claimed in claim 12, wherein the color pigment and another color pigment are provided simultaneously.

14. The method as claimed in claim 12, wherein the color pigment and another color pigment are provided sequentially.

15. The method as claimed in claim 10, wherein the step of providing the color pigment comprises spraying the color pigment on the substrate by using an inkjet print head.

16. The method as claimed in claim 15, wherein the step of spraying the color pigment on the substrate by using an inkjet print head comprises moving the substrate and the inkjet print head with respect to each other along the continuous pigment-providing route.

17. The method as claimed in claim 10, further comprising forming a conductive layer on the substrate after Step (b).

18. The method as claimed in claim 10, further comprising:
providing the color pigment on a secondary continuous pigment-providing route to form the color pigment in the sequence of pixel regions among the plurality of pixel regions and on at least a part of the partition.

* * * * *